HIGH Q RADIO FREQUENCY CIRCUIT EMPLOYING A SUPERCONDUCTIVE LAYER ON A POROUS THERMALLY MATCHED SUBSTRATE

Filed April 20, 1967

INVENTORS
IRA WEISSMAN
MALCOLM L. KINTER
BY
ATTORNEY

United States Patent Office 3,441,880

Patented Apr. 29, 1969

3,441,880

HIGH Q RADIO FREQUENCY CIRCUIT EMPLOYING A SUPERCONDUCTIVE LAYER ON A POROUS THERMALLY MATCHED SUBSTRATE

Ira Weissman, Palo Alto, and Malcolm L. Kinter, Menlo Park, Calif., assignors to Varian Associates, Palo Alto, Calif., a corporation of California Filed Apr. 20, 1967, Ser. No. 632,415
Int. Cl. H01p *1/00, 7/06;* H01j *7/26*
U.S. Cl. 333—99 10 Claims

ABSTRACT OF THE DISCLOSURE

High Q radio frequency circuits such as reference cavity resonators for frequency standards and coupled cavity circuits for linear particle accelerators are disclosed. Such circuits comprise a radio frequency wave supportive structure formed by a superconductive layer disposed on a porous metallic substrate. The substrate has a coefficient of linear thermal expansion which is about equal to that of the superconductive layer such that thermally produced strains of the superconductive layer are prevented in use and fabrication.

In a preferred embodiment, the porous metal substrate is made of the same material as that of the superconductive layer to facilitate obtaining a good bond therebetween. Suitable superconductive layers include pure lead and pure niobium. Suitable substrate materials include sintered lead-antimony and lead-arsenic alloys for use with a lead superconductive layer and sintered niobium for use with a non-porous niobium superconductive layer. The porous substrate is immersed in superfluid helium, i.e. liquid helium below 2.2° K. Superfluid helium is characterized by having zero viscosity and infinite thermal conductivity. The superfluid helium permeates the pores of the substrate to cool the superconductive layer. In the process, at least some of the superfluid helium is heated to normal liquid helium which forms a counter stream flowing away from the superconductive layer. In one embodiment, the substrate is provided with a multitude of larger holes which penetrate into the substrate, in a waffle-like manner, to facilitate the counter flow of normal liquid helium.

*Description of the prior art*

Heretofore, superconductive layers of both lead and niobium have been deposited upon a pure cold worked copper substrate. While the copper substrate provided sufficient strength and thermal conductivity at cryogenic temperatures, its coefficient of linear thermal expansion differed substantially from those of the lead and niobium superconductive layers. As a result, the superconductive layer was rather severely strained, when cooled from the deposition temperature to cryogenic temperatures, thereby substantially degrading the Q of the microwave circuits formed in this manner.

*Summary of the present invention*

The principal object of the present invention is the provision of an improved superconductive radio frequency wave supportive structure and apparatus using same.

One feature of the present invention is the provision, in a radio frequency apparatus, of a high Q radio frequency wave supportive structure formed by a layer of superconductive material, for conducting the radio frequency currents, disposed on a porous metallic substrate, whereby a superfluid coolant may permeate the pores of the substrate for cooling the superconductive layer.

Another feature of the present invention is the same as the preceding wherein a preponderance of the constituents of the superconductive layer and of the substrate are the same to obtain approximately equal coefficients of linear thermal expansion and to facilitate bonding between the superconductive layer and the substrate.

Another feature of the present invention is the same as any one or more of the preceding features wherein the porous metal substrate is additionally penetrated by a multitude of larger holes to facilitate flow of normal liquid helium away from the superconductive layer without weakening the substrate excessively.

Another feature of the present invention is the same as any one or more of the preceding features wherein the superconductive layer is selected from the class consisting of lead and niobium and the porous substrate is selected from the class consisting of lead-antimony alloys, lead-arsenic, and niobium.

Another feature of the present invention is the same as any one or more of the preceding wherein the radio frequency wave supportive structure is employed in a microwave linear particle accelerator or as a reference cavity resonator in a frequency standard.

Other features and advantages of the present invention will become apparent upon a perusal of the following specification taken in connection with the accompanying drawings wherein:

*Description of the preferred embodiments*

Figures 1, 2, 3, 4, 5, 6:
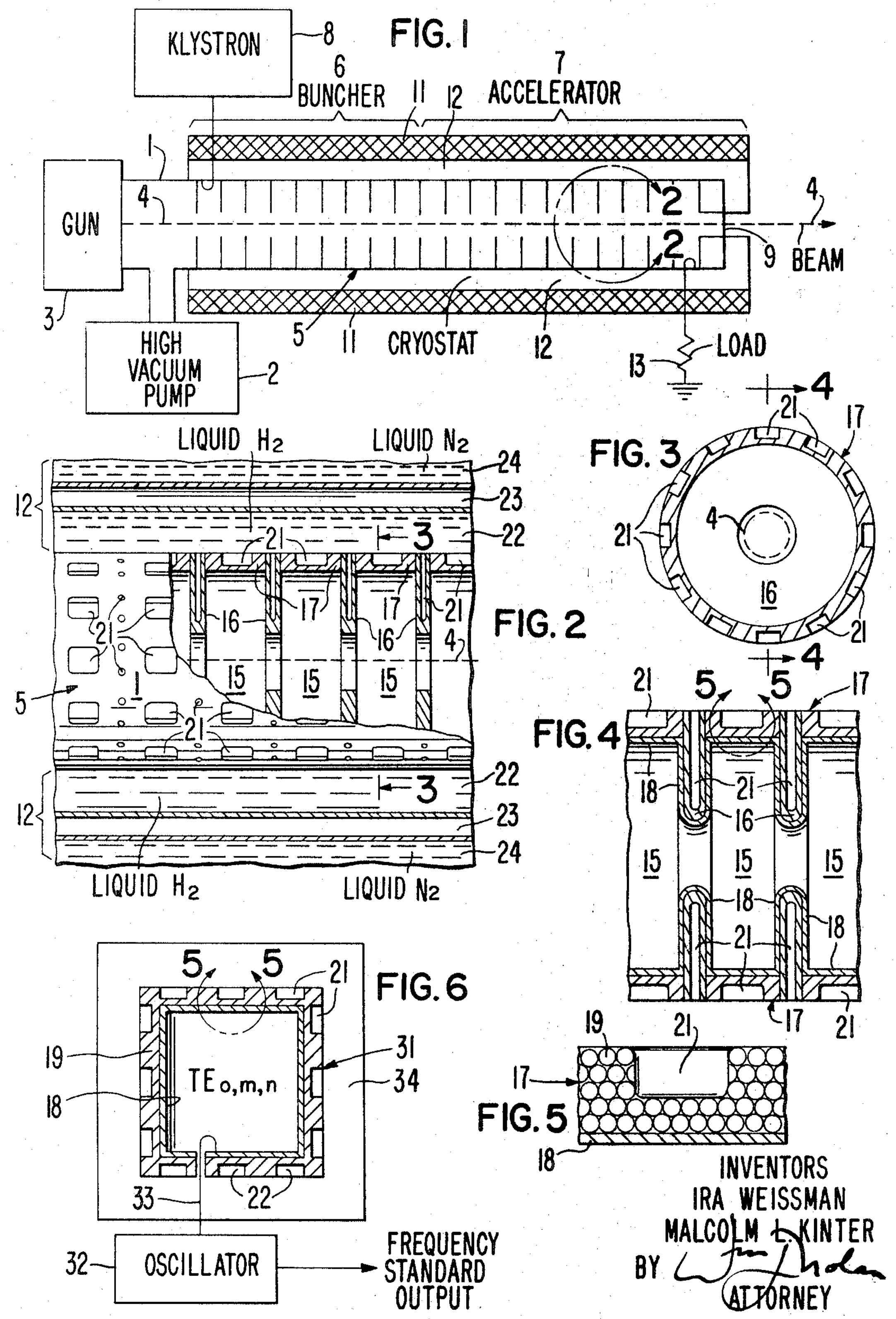
FIG. 1 is a schematic diagram, partly in section and partly in block diagram form, of a linear particle accelerator employing features of the present invention.
FIG. 2 is an enlarged view, partly in section, of a portion of the structure of FIG. 1 delineated by line 2—2.
FIG. 3 is a sectional view of a portion of the structure of FIG. 2 taken along line 3—3 in the direction of the arrows.
FIG. 4 is a sectional view of one of the cavity resonators taken along line 4—4 of FIG. 3 in the direction of the arrows.
FIG. 5 is an enlarged view of a portion of the structure of FIGS. 4 and 6 delineated by line 5—5.
FIG. 6 is a schematic view, partly in section and partly in block diagram form, of a frequency standard employing features of the present invention.

Referring now to FIG. 1, there is shown a microwave linear particle accelerator incorporating features of the present invention. The particle accelerator comprises an elongated vacuum envelope 1 evacuated to a low pressure, as of $10^{-8}$ torr., via a high vacuum pump 2. An electron gun assembly 3 is disposed at one end of the envelope 1 for forming and projecting a beam of electrons 4 axially of the envelope 1 into a radio frequency accelerator structure.

The accelerator structure includes a disk loaded waveguide 5 separated into two successive sections, a buncher section 6 and an accelerator section 7. The disk loaded waveguide 5 is excited with radio frequency wave energy at, for example 10 cm. wavelength, obtained from the output of a klystron amplifier 8. In the buncher section 6, the electron beam is accelerated and bunched into packets of electrons. These packets are further accelerated in the accelerator section 7 to nearly the velocity of light. The high velocity electrons exit from the envelope 1 by being driven through a thin foil 9, as of aluminum, at the end of the accelerator.

An electrical solenoid 11 surrounds the disk loaded waveguide 5 for focusing the electron beam therethrough. A cryostat 12 is disposed surrounding the disk loaded waveguide 5 between the solenoid 11 and the waveguide 5. The cryostat 12 is more fully described below and serves to maintain the disk loaded waveguide 5 at cryogenic temperatures as of, for example, 1.85° K. Remanent R.F. power, reaching the terminal end of the accelerator section 7, is coupled out of the disk loaded waveguide 5 to a lossy termination 13.

Referring now to FIGS. 2–5, the disk loaded waveguide 5 comprises a plurality of coupled cavity resonators 15 defined by the spaces between successive centrally apertured disks 16 which are disposed transversely of a cylindrical waveguide 17.

The interior wall surfaces of the disk loaded waveguide 5 are formed by a layer of superconductive material 18 (see FIG. 4). The layer 18, as of 5 microns to 10 mils thick, is disposed on a substrate structure 19 which serves to support the superconductive layer and to allow for cooling of the superconductive layer 18.

The substrate structure 19 is formed of a porous metal matrix of a metal having substantial strength and approximately the same average coefficient of linear thermal expansion as that of the superconductive layer 18. This prevents unwanted strains from being produced in the superconductive layer 18 which would otherwise adversely affect the Q of the radio frequency circuit. A suitable average coefficient of linear thermal expansion for the substrate is within plus or minus 20% of that of the superconductive layer from deposition temperature to 1.85° K.

The pores of the porous substrate 19 provide superfluid coolant passageways which penetrate the substrate 19 and extend to or nearly to the superconductive layer 18, depending upon surface treatment prior to deposition of the layer, for cooling same in use. More particularly, liquid helium below 2.2° K. is a superfluid, i.e., it is characterized by having zero viscosity and infinite thermal conductivity. Thus, liquid helium below 2.2° K. permeates the pores of the porous substrate 19 for cooling the superconductive layer 18. As the superfluid helium coolant absorbs heat some becomes normal liquid helium and counter flows through the pores in the porous substrate 19.

In a preferred embodiment, a multitude of holes 21 of dimensions substantially larger than those of the pores in the substrate 19 are formed in the substrate 19. These holes 21 penetrate well into the substrate and terminate near the superconductive layer 18. The holes 21 may take the form of a waffle-like pattern as shown in FIG. 2. Longer and smaller diameter bores extend radially into the interior of the disk portions of the substrate 19. The holes 21 provide liquid passageways for egress of normal helium liquid which does not have the low viscosity of the colder superfluid helium.

The superconductive layer 18 may be formed on the substrate 19 by any one of a number of conventional methods such as chemical vapor deposition, evaporation, or by electrodeposition.

Suitable superconductive layers 18 are selected from the class consisting of niobium, $Nb_3Sn$, NbZr, tantalum, and vanadium. Preferred materials are pure niobium or pure lead. The superconductive layer is preferably polished, as by electropolishing or chemical polishing, to provide a surface finish which is characterized by having substantially no surface irregularities greater than 1 micron in size.

Suitable porous substrate materials comprise metals selected from the class consisting of lead-antimony alloys, lead-arsenic alloys, niobium, $Nb_3Sb$, NbZr, tantalum, vanadium, and tungsten. The porous substrate 19 may be made in acccordance with conventional sintered powder techniques. The porous substrate may be infiltrated with a ductile metal or material to facilitate machining. After machining, the ductile material may be selectively removed as by chemically leaching to leave the porous substrate structure. In some instances, it may be desirable to form the superconductive layer on the infiltrated metal matrix and then to remove all the ductile material leaving the porous substrate supporting the superconductive layer

18. In some instances it may be desirable to remove all but a thin layer, up to 10 microns, of the ductile material on which the superconductive layer is deposited. This thin layer may comprise an alloy such as would result from infilatrating tin into a hard lead matrix.

In one preferred embodiment, a pure solid niobium superconductive layer 18 is formed on a porous niobium substrate which has a density of about 35% to 50% of that of a solid niobium substrate 19.

In another preferred embodiment, a pure solid lead superconductive layer 18 is formed on a porous lead-antimony alloy as of approximately 40% density and having about 6 to 8% antimony. Such a lead alloy has a coefficient of linear thermal expansion only a few percent less than that of lead and a tensile strength as much as 6 times as great as that of lead.

Cavities 15, employing the unstrained superconductive lead layer 18, provide a cavity Q on the order of $10^9$. Such a high Q permits the radio frequency electric fields of the disk loaded waveguide to be raised to a very high level and high duty cycle without overheating the disk loaded structure. Such high fields and high duty cycle permit the linear accelerator to be reduced in length and size and to provide higher output beam current.

The cryostat 12, which surrounds the disk loaded waveguide 5, comprises a central cylindrical chamber 22 containing the disk loaded waveguide 5 and is filled with liquid helium at reduced pressure, as of 20 torr. A thin annular evacuated chamber 23 surrounds the helium chamber 22 and an annular liquid nitrogen filled chamber 24 surrounds the evacuated chamber 23.

Referring now to FIG. 6, there is shown a frequency standard employing a high Q superconductive cavity resonator 31 incorporating features of the present invention. The cavity resonator 31 forms a reference cavity for controlling the frequency of an oscillator 32 which is coupled to the cavity 31 via a transmission line 33. An output of the oscillator 32 serves as the frequency standard output. A cryostat 34 surrounds the cavity 31 for maintaining the cavity 31 at a cryogenic temperature, as of 1.85° K.

The cavity resonator 31 is a cylindrical resonator dimensioned for operation on one of the higher order high Q circular electric modes such as, for example, a $TE_{o,m,n}$ mode, where *o* is zero, *m* is one or more and *n* is 4 or more. The cavity 31, as shown in FIGS. 2–5, has a superconductive layer 18 disposed on a thermally matched porous substrate 19 which is infiltrated by the superfluid coolant, as previously described herein.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In a radio frequency apparatus, means forming a radio frequency wave supportive structure, said wave supportive structure including a substrate member and a superconductive radio frequency wave supportive layer disposed thereon, the improvement wherein, said substrate member is a porous structure formed and arranged such that the pores provide a multitude of superfluid coolant passageways penetrating into said substrate member for cooling said substrate member and said superconductive layer in use.

2. The apparatus of claim 1 wherein a preponderance of the constitutents of said superconductive layer are of the same material as a preponderance of the constituents of said substrate member.

3. The apparatus of claim 1 wherein said superconductive layer and said substrate member are made of the same metals.

4. The apparatus of claim 1 wherein said substrate member is penetrated by a multitude of holes having substantially larger dimensions than the pores of said porous structure to facilitate egress of non-superfluid coolant.

5. The apparatus of claim 1 wherein said superconductive layer is lead and said substrate member is formed of porous lead alloy selected from the class of lead-arsenic and lead-antimony alloys.

6. The apparatus of claim 1 wherein said superconductive layer is niobium and said substrate member is made of porous niobium.

7. The apparatus of claim 1 including means forming a cryostat having a chamber containing a superfluid coolant, and said radio frequency wave supportive structure being immersed in said superfluid coolant.

8. The apparatus of claim 7 which said radio frequency wave supportive structure includes a cavity resonator structure.

9. The apparatus of claim 7 wherein the radio frequency apparatus is a linear particle accelerator, and said radio frequency wave supportive structure is a disk loaded waveguide.

10. The apparatus of claim 8 wherein the radio frequency apparatus is a frequency standard, and said cavity resonator structure is a reference frequency resonator for the frequency standard.

No references cited.

HERMAN KARL SAALBACH, *Primary Examiner.*

L. ALLAHUT, *Assistant Examiner.*

U.S. Cl. X.R.

313—36; 174—15; 333—31, 83; 315—2.5